United States Patent
Okajima

(10) Patent No.: US 7,321,147 B2
(45) Date of Patent: Jan. 22, 2008

(54) SEMICONDUCTOR DEVICE INCLUDING A TRENCH CAPACITOR

(75) Inventor: Mutsumi Okajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/332,153

(22) Filed: Jan. 17, 2006

(65) Prior Publication Data

US 2007/0102744 A1 May 10, 2007

(30) Foreign Application Priority Data

Nov. 10, 2005 (JP) ............................. 2005-325580

(51) Int. Cl.
*H01L 29/94* (2006.01)
(52) U.S. Cl. ............... 257/301; 257/304; 257/E27.092
(58) Field of Classification Search ............... 257/301, 257/304, 305, 302, E27.082; 438/386
See application file for complete search history.

(56) References Cited

U.S. PATENT DOCUMENTS

| 6,291,286 B1 * | 9/2001 | Hsiao ........................ 438/238 |
| 6,426,526 B1 * | 7/2002 | Divakaruni et al. ........ 257/302 |
| 6,872,629 B2 * | 3/2005 | Hsiao et al. ................ 438/386 |
| 6,917,064 B2 * | 7/2005 | Kito et al. ................... 257/301 |
| 7,081,382 B2 * | 7/2006 | Hsu ........................... 438/243 |
| 7,153,738 B2 * | 12/2006 | Cheng et al. ............... 438/248 |
| 2005/0196918 A1 * | 9/2005 | Schwerin .................... 438/243 |

FOREIGN PATENT DOCUMENTS

JP     2001-196555     7/2001

OTHER PUBLICATIONS

Amon et al., "A Highly Manufacturable Deep Trench Based DRAM Cell Layout with a Planar Array Device in a 70nm Technology", IEDM, Tech. Dig., 4 sheets, (2004).

* cited by examiner

*Primary Examiner*—T. N. Quach
(74) *Attorney, Agent, or Firm*—Finnegan, Henderson, Farabow, Garrett & Dunner, L.L.P.

(57) ABSTRACT

A device including a trench capacitor formed in a semiconductor substrate for configuring a DRAM cell together with a cell transistor is provided. The device also includes a cell transistor including diffused regions formed in a surface of a semiconductor substrate; a trench capacitor formed in said semiconductor substrate for configuring a DRAM cell together with said cell transistor; a buried strap formed in said semiconductor substrate to connect said diffused region to said trench capacitor; and a collar insulation film formed on sides of said buried strap.

3 Claims, 20 Drawing Sheets

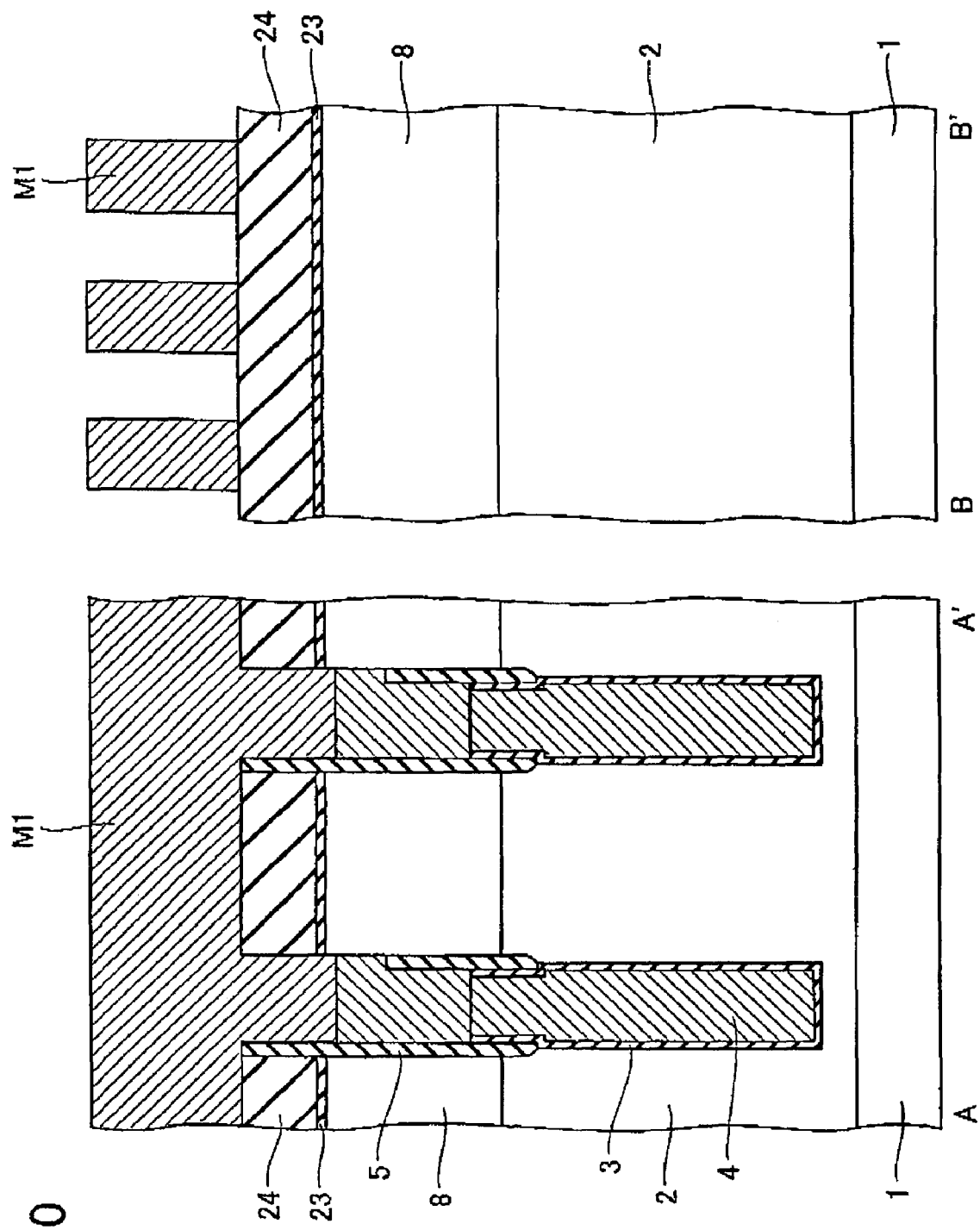

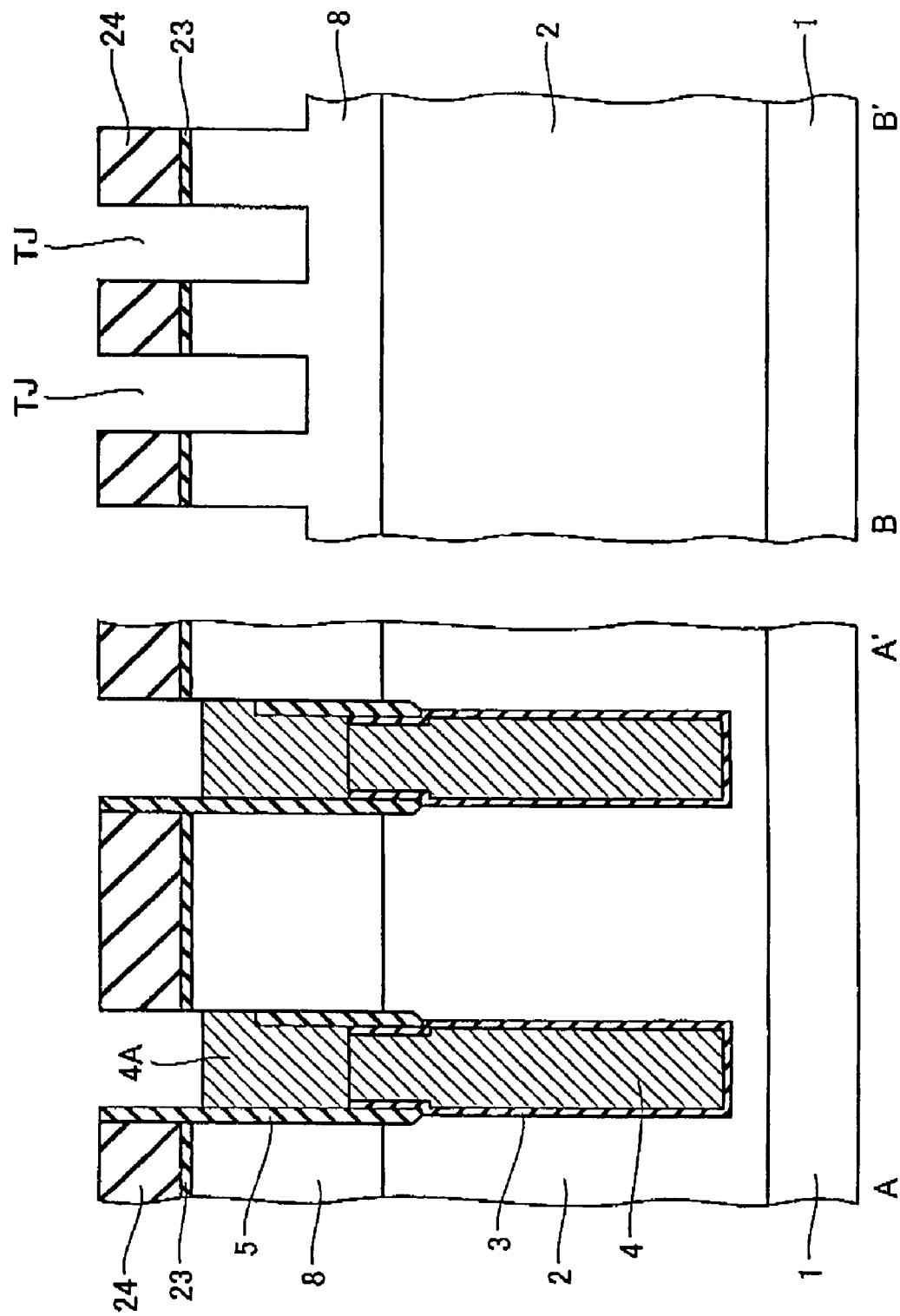

SEMICONDUCTOR DEVICE INCLUDING A TRENCH CAPACITOR

CROSS REFERENCE TO RELATED APPLICATION

This application is based on and claims the benefit of priority from prior Japanese Patent Application No. 2005-325580, filed on Nov. 10, 2005, the entire contents of which are incorporated herein by reference.

BACKGROUND OF THE INVENTION

1. Field of the Invention

The present invention relates to a semiconductor device and method of manufacturing the same. In particular, it relates to a semiconductor device including a DRAM cell composed of a trench capacitor and a cell transistor, and a method of manufacturing the same.

2. Description of the Related Art

A DRAM including 1-transistor/1-capacitor memory cells is required to have a downsized cell area for high integration. Downsizing of the cell area basically requires reductions in respective areas occupied by components, or the transistor and the capacitor. As for the capacitor, the problem is how to ensure a required capacitor capacitance in a small cell-occupied area. Thus, developments are proceeding in structure and so forth for achieving a high-permittivity capacitor insulator and for increasing an effective capacitor area. Another DRAM is also widely employed, which includes a capacitor having a trench capacitor structure extending in a direction perpendicular to a substrate. In such the trench capacitor structure, it is important to structure a connection between a storage node electrode of the trench capacitor and a source/drain-diffused layer of a cell transistor.

A buried strap structure is known as one of those structures. The buried strap is formed by burying material such as polysilicon in the trench to connect the storage node electrode of the trench capacitor to the source/drain-diffused layer of the cell transistor. A method of manufacturing a semiconductor device including such the buried strap is known from JP-A 2001-196555 (paragraphs [0044]-[0045], Patent Document 1), for example. In the manufacturing method of Patent Document 1, a buried strap is formed adjoining transistor formation regions at both left and right sides on the trench capacitor. Then, an island-shaped resist pattern for formation of device isolation trenches (STI) is formed per a number of trench capacitors formed in the shape of a grid. Thereafter, the island-shaped resist pattern is used as a mask for etching one side of the buried strap. Then, a device isolation film is buried in device isolation trenches formed by the etching to form a buried strap that connects one cell transistor to one trench capacitor. It becomes difficult to form such the island-shaped resist pattern as shown in Patent Document 1, however, as fine patterning of elements proceeds.

To solve the problem, there is a method of manufacturing a semiconductor device including a buried strap, which is manufacturable without forming the discrete island-shaped resist pattern and only with the so-called line-and-space shaped resist pattern. This method is proposed by J. Amon et al., A highly manufacturable deep trench based DRAM cell layout with a planar array device in a 70 nm technology, IEDM Tech. Dig, pg. 73, 2004 (Non-Patent Document 1). In the manufacturing method of this document, a buried strap is formed adjoining transistor formation regions at both left and right sides on the trench capacitor. Then, a silicon nitride film and an amorphous silicon film are deposited over the entire surface including the inside of the trench for a trench capacitor. Thereafter, ions of boron (B) or the like are implanted into the amorphous silicon film by slanting ion implantation to introduce B into the amorphous silicon film except for the portion shaded on ion implantation. Then, an alkali-based wet etching is applied to etch the amorphous silicon film off the portion to which B is not introduced, and followed by wet etching to etch the silicon nitride film off the portion from which the amorphous silicon film was removed. Thereafter, the remaining amorphous silicon film and the buried strap are removed with a mask of the silicon nitride film. A device isolation film is buried in the device isolation trench thus formed to form a buried contact that is brought into contact with only one side of the transistor formation region. The manufacturing method of this non-patent document requires no formation of the island-like separated resist pattern and can respond to proceeding of fine patterning. There is a problem in the method, however, because formation of the amorphous silicon film that does not eventually become a component of the device increases the number of process steps and increases the production cost correspondingly.

SUMMARY OF THE INVENTION

In one aspect the present invention provides a method of manufacturing semiconductor devices including a trench capacitor formed in a semiconductor substrate for configuring a DRAM cell together with a cell transistor. The method comprises forming a trench in a semiconductor substrate; forming a collar insulation film on sidewalls of the trench, the collar insulation film extending to a surface of the semiconductor substrate; forming a trench capacitor in the trench; introducing ions into a part of the collar insulation film by implanting ions of an impurity from one of slanting directions; etching off the ion-introduced part of the collar insulation film through the use of a difference in etching rate from other parts of the collar insulation film; and forming a buried strap in the trench above the trench capacitor.

In one aspect the present invention provides a semiconductor device, which comprises a cell transistor including diffused regions formed in a surface of a semiconductor substrate; a trench capacitor formed in the semiconductor substrate for configuring a DRAM cell together with the cell transistor; a buried strap formed in the semiconductor substrate to connect the diffused region to the trench capacitor; and a collar insulation film formed on sides of the buried strap. The buried strap is isolated from the semiconductor substrate at the opposite side far from the cell transistor by the collar insulation film extending to the surface of the semiconductor substrate.

BRIEF DESCRIPTION OF THE DRAWINGS

FIG. 10 shows a process step of manufacturing the semiconductor device according to the first embodiment;

FIG. 11 shows a process step of manufacturing the semiconductor device according to the first embodiment;

DETAILED DESCRIPTION OF THE INVENTION

Embodiments of the present invention will now be described in detail with reference to the drawings.

First Embodiment

Figure 1:
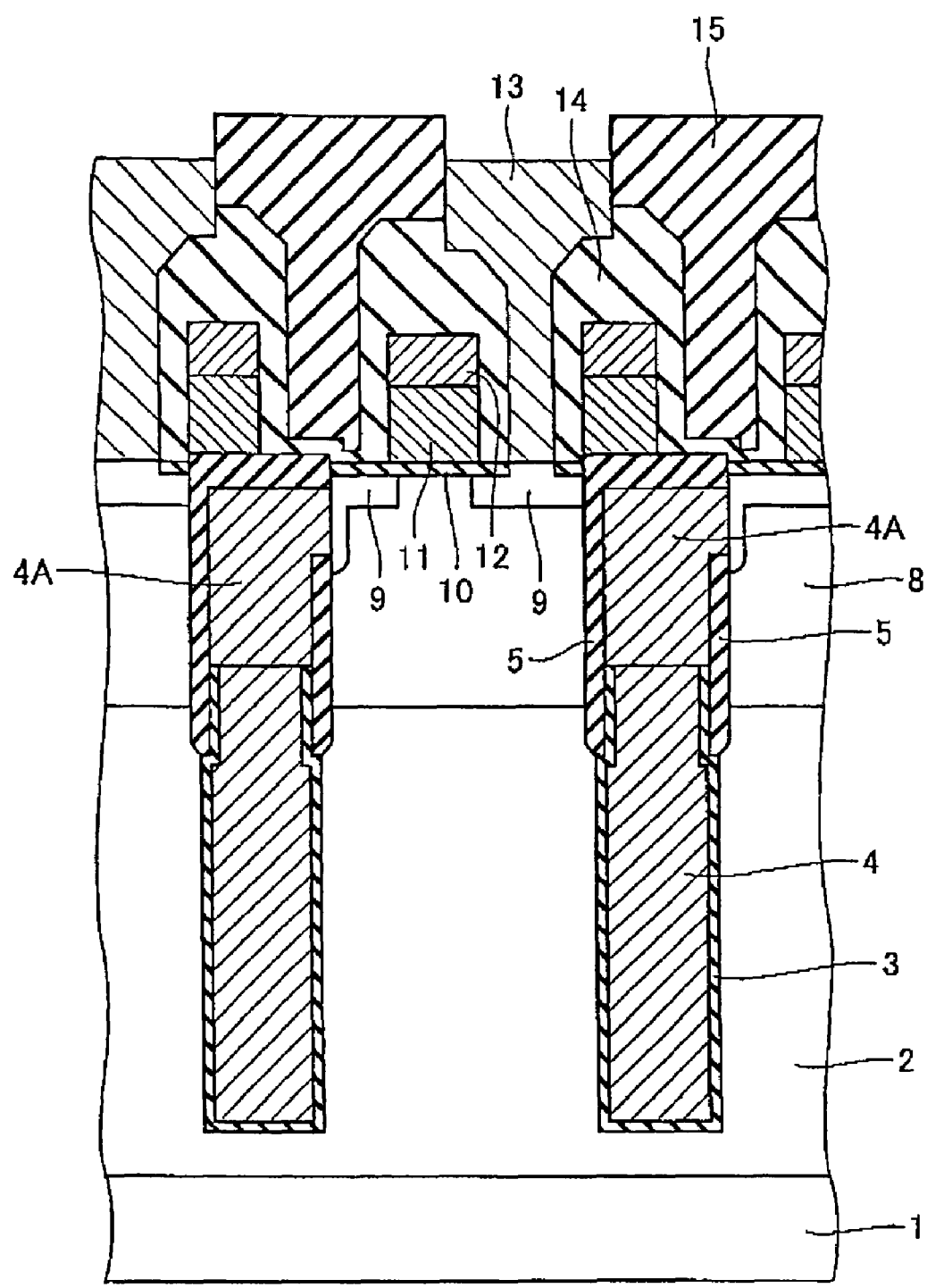
FIG. 1 shows a cross-sectional view of a semiconductor device according to a first embodiment of the present invention.

FIG. 1 shows a cross-sectional view of a semiconductor device according to a first embodiment of the present invention. The semiconductor device comprises a semiconductor substrate 1, which includes a trench capacitor for configuring part of a DRAM cell together with a cell transistor.

The trench capacitor includes a plate-diffused layer 2, a node insulation film 3, and a storage node electrode 4, formed in the semiconductor substrate 1. The plate-diffused layer 2 is formed by implanting ions of arsenic (As) or phosphorous (P) into the semiconductor substrate 1 from a trench for trench capacitor formation formed in the semiconductor substrate 1 and then thermally diffusing the ions.

The node insulation film 3 is formed by depositing a high dielectric film such as an NO film and an $Al_2O_3$ film on the trench sidewall.

The storage node electrode 4 is formed by burying polysilicon, for example, inside the trench up to the level slightly exceeding the upper surface of the plate-diffused layer 2 after formation of the node insulation film 3. A collar insulation film 5 composed of silicon oxide, for example, is formed on the trench sidewall. The collar insulation film 5 has a function to isolate the above-described, plate-diffused layer 2 from a diffused layer of the cell transistor.

The collar insulation film 5 is initially formed over the whole circumference of the cylindrical trench sidewall. In the subsequent steps, however, it is formed in the shape as shown in FIG. 1 (of a semicircular arc when seen from above) by etching off a part thereof facing the cell transistor in the later-described step.

A buried strap 4A is buried in the trench above the storage node electrode 4, for example, such that it is connected to the cell transistor at the part from which the collar insulation film 5 is removed. In other words, the buried strap 4A is insulated from the semiconductor substrate 1 at the opposite side far from the cell transistor by the collar insulation film 5 extending to the surface of the semiconductor substrate 1.

In the surface of the semiconductor substrate 1 adjoining the buried strap 4A, that is, in a base region 8, a MOS transistor is formed to configure a DRAM cell together with the trench capacitor. This transistor includes source/drain-diffused regions 9, and a gate electrode 11 formed, on a gate insulator 10 between the source/drain-diffused regions 9. Formed on the upper surface of the gate electrode 11 is a WSi layer 12 serving as a word line of DRAM. One of the source/drain-diffused regions 9 is connected to a transistor wire 13 serving as a bit line. To isolate the transistor wire 13 and the WSi layer 12 from each other, interlayer insulators 14 and 15 are formed.

Thus, in the semiconductor device of this embodiment, the side of the buried strap 4A opposite the cell transistor is separated not by the device isolation film buried in the device isolation trench but by the collar insulation film 5. Therefore, it is possible to simplify the process steps as described later and easily respond to fine patterning of elements.

Figure 2:
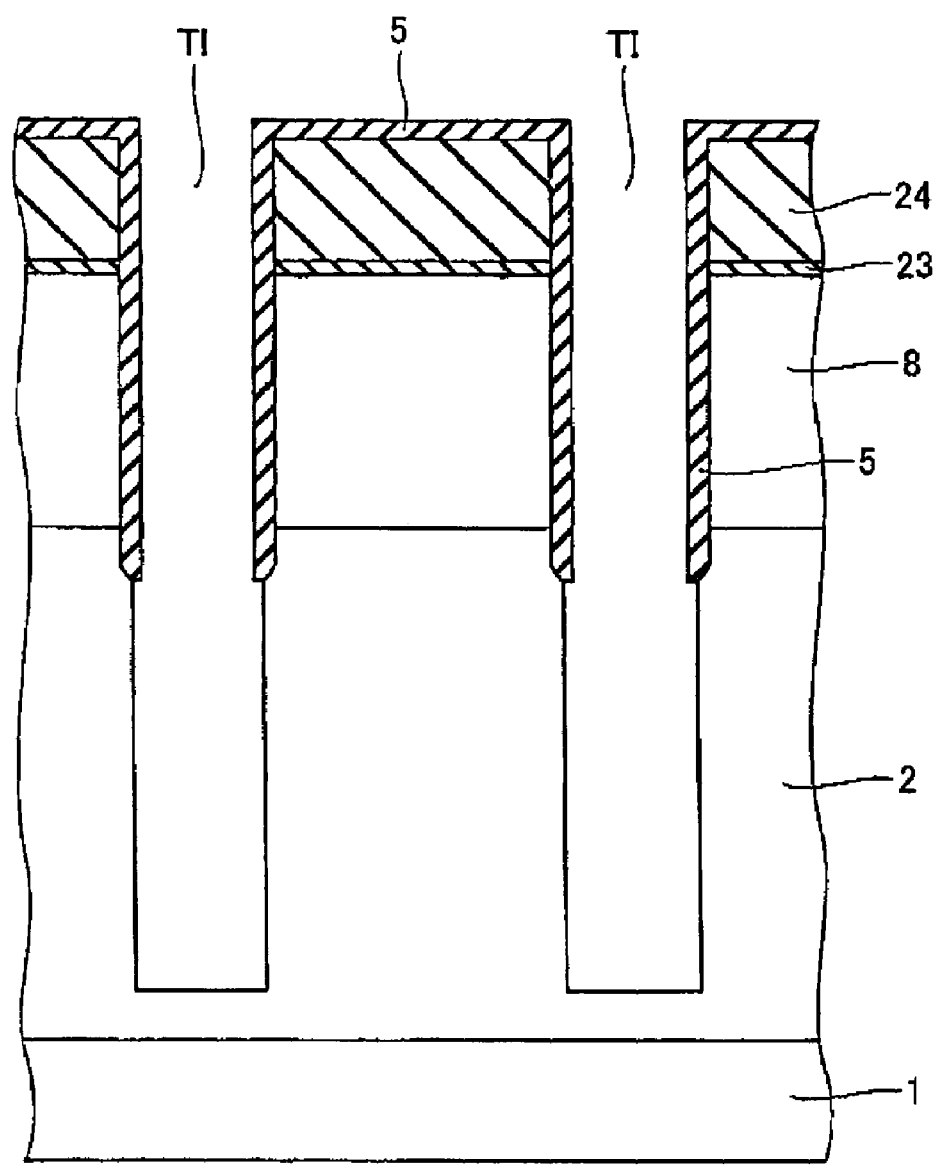
FIG. 2 shows a process step of manufacturing the semiconductor device according to the first embodiment.

An example of the process steps of manufacturing the semiconductor device of the first embodiment is described next with reference to FIGS. 2-11. First, as shown in FIG. 2, a silicon oxide film 23 and a silicon nitride film 24, formed on the semiconductor substrate 1, are used as a mask for etching to form a number of trenches TI at certain intervals. Over the entire surface of the semiconductor substrate 1 including the portions above the sides of the trenches TI, the collar insulation film 5 is formed with a thickness of 20 nm, for example. Then, ions of As or P are implanted into the trenches TI and thermally diffused to form the plate-diffused layer 2.

Figure 3:
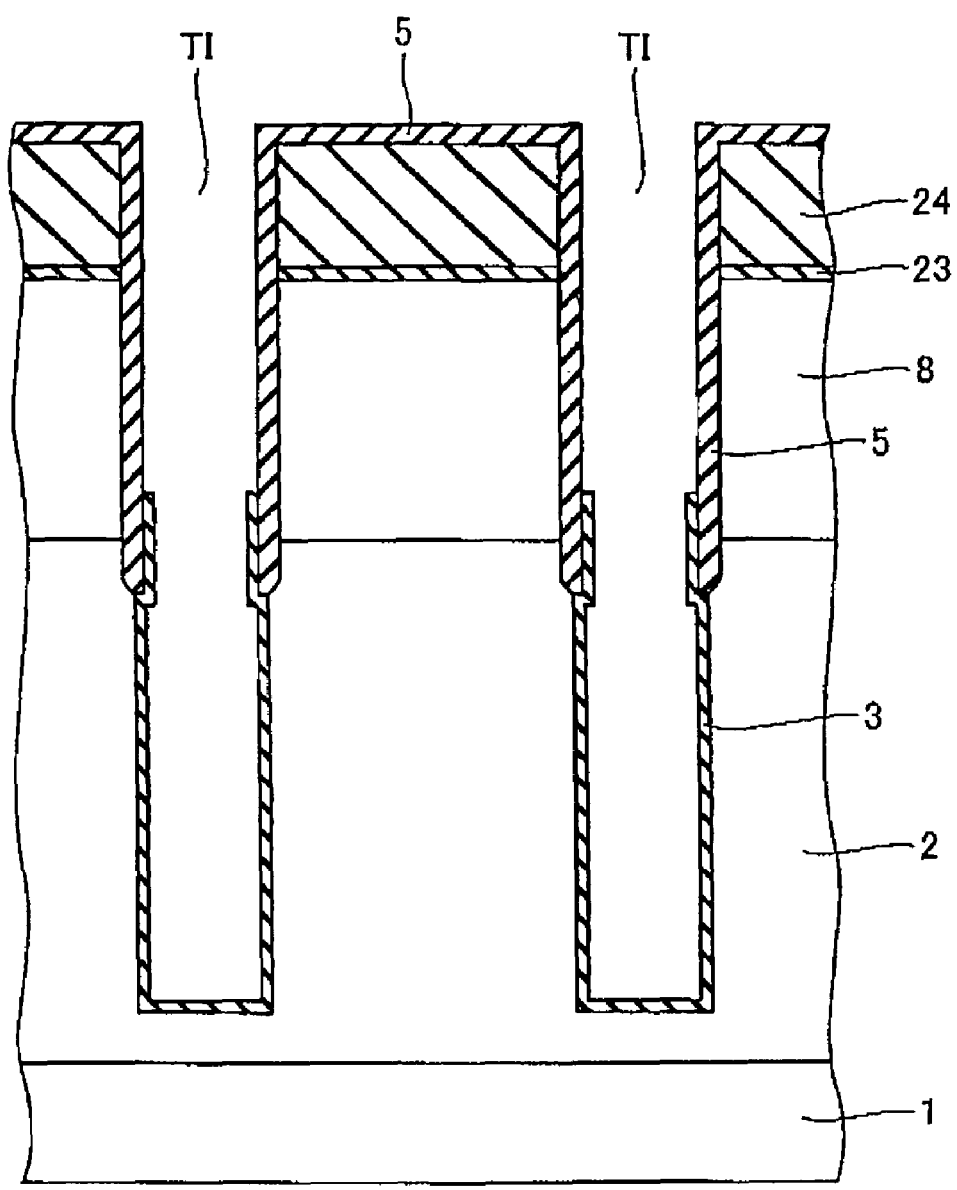
FIG. 3 shows a process step of manufacturing the semiconductor device according to the first embodiment.
Figure 4:
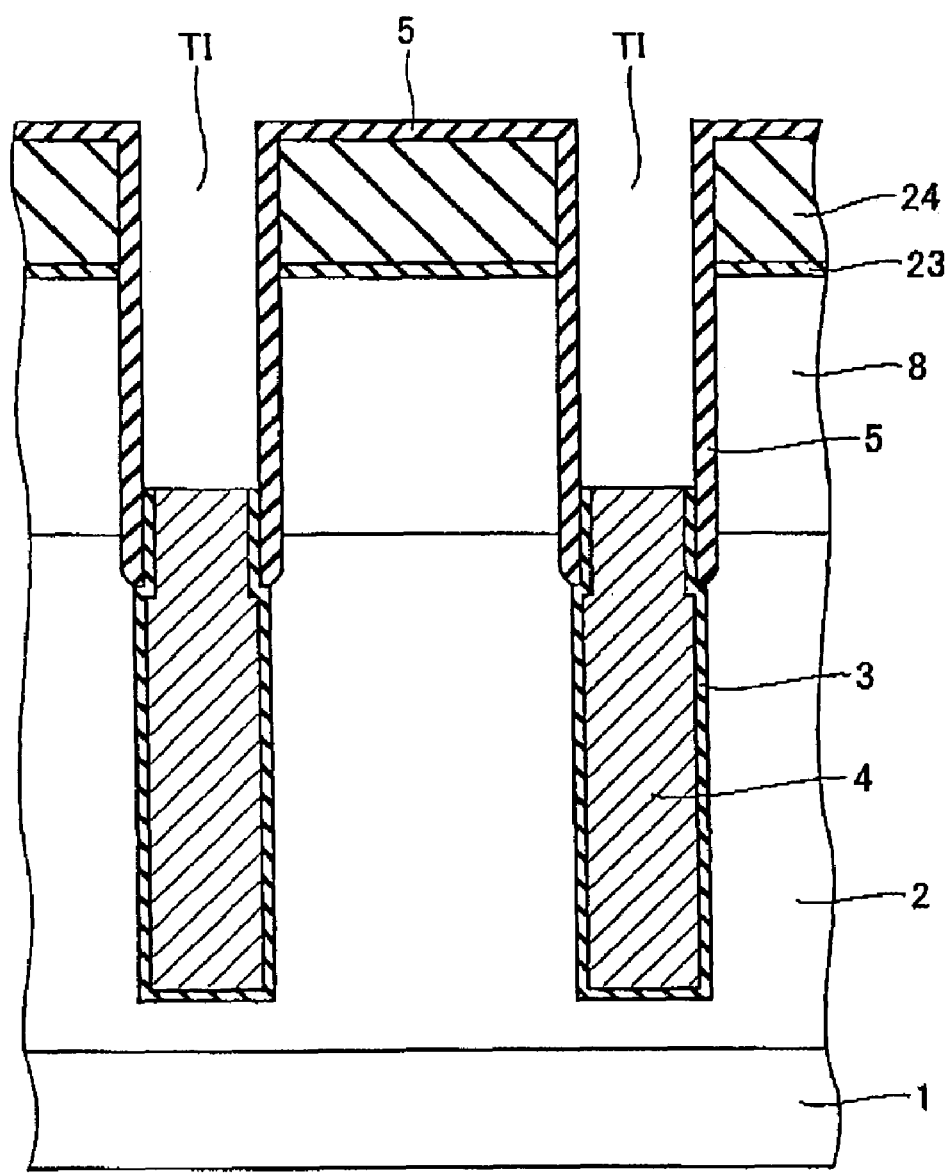
FIG. 4 shows a process step of manufacturing the semiconductor device according to the first embodiment.
Figure 5:
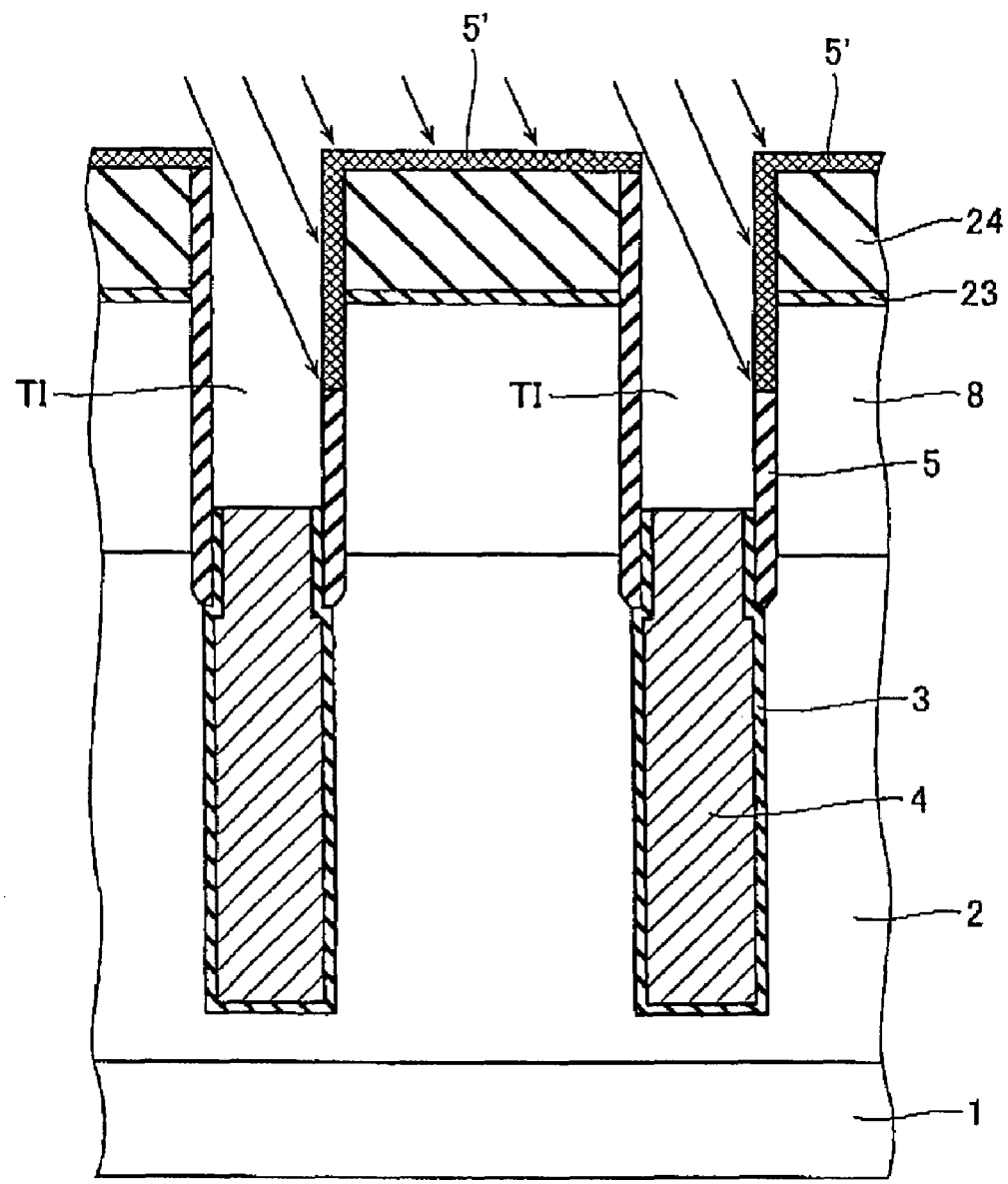
FIG. 5 shows a process step of manufacturing the semiconductor device according to the first embodiment.

Next, as shown in FIG. 3, the node insulation film 3 composed of a high dielectric film such as an NO film and an $Al_2O_3$ film is formed on the portions in the trench TI not provided with the collar insulation film 5. Subsequently, as shown in FIG. 4, polysilicon serving as material of the storage node electrode 4 is deposited on the surface including the inside of the trench TI and then etched back by a dry etching to form the storage node electrode 4. Subsequently, as shown in FIG. 5, from one direction toward the trench TI, specifically toward the contact between the cell transistor and the buried strap 4A, ions of either one of boron (B), phosphorous (P), arsenic (As), antimony (Sb), silicon (Si), or germanium (Ge) are implanted into the collar insulation film 5. Because of the ion implantation from one direction, ions are implanted into only a part 5' of the collar insulation film 5, and not into other parts shaded on ion implantation. When B, P, As, or Sb is employed, a process of heating at 800° C. for a short time may be added.

Figure 6:
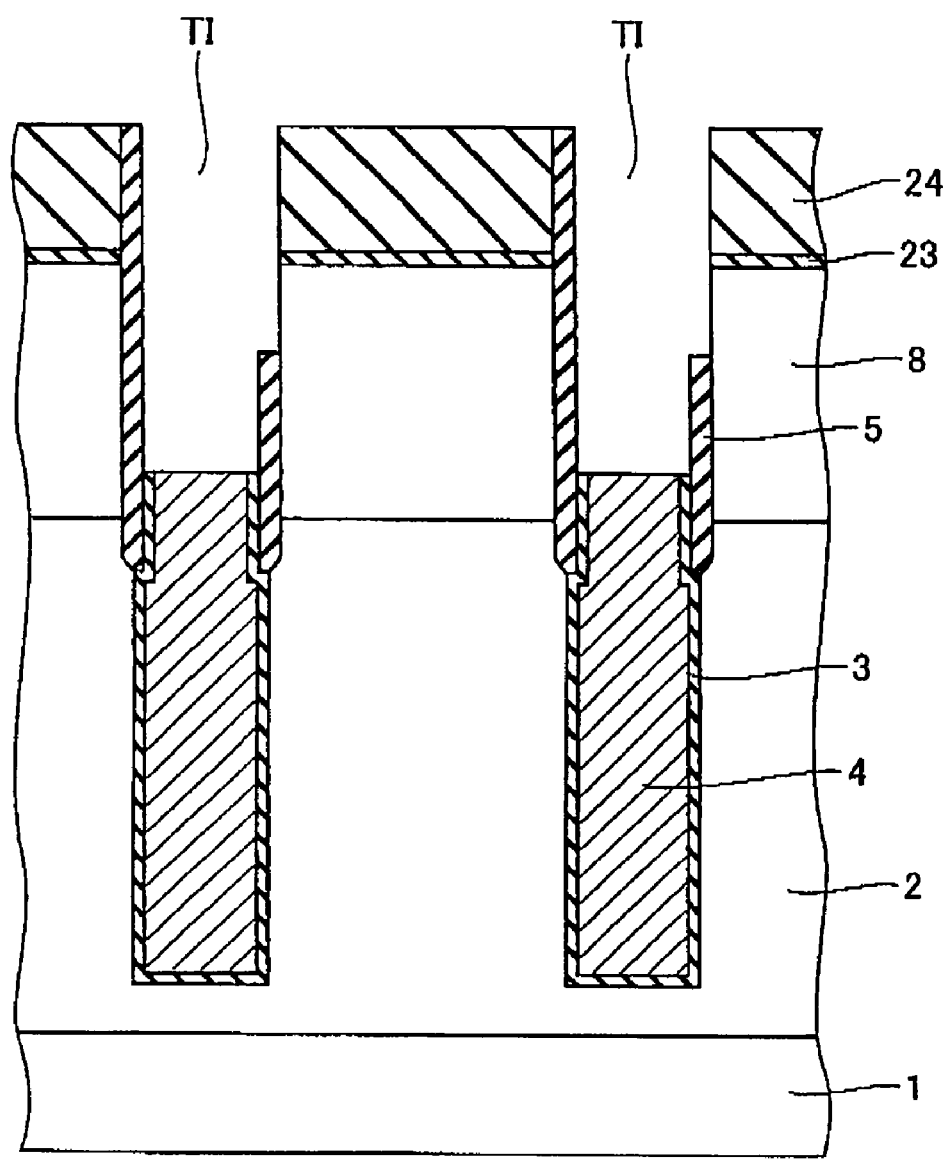
FIG. 6 shows a process step of manufacturing the semiconductor device according to the first embodiment.

Subsequently, a chemical solution containing hydrogen fluoride (HF), or otherwise HF vapor is employed to apply wet etching to the collar insulation film 5. In this case, the part 5' ion-implanted has a higher etching rate than other parts not ion-implanted have. Therefore, as shown in FIG. 6, only the part 5' is etched, and other parts of the collar insulation film 5, that is, the parts shaded on ion implantation and not ion-implanted can remain.

Figure 7:
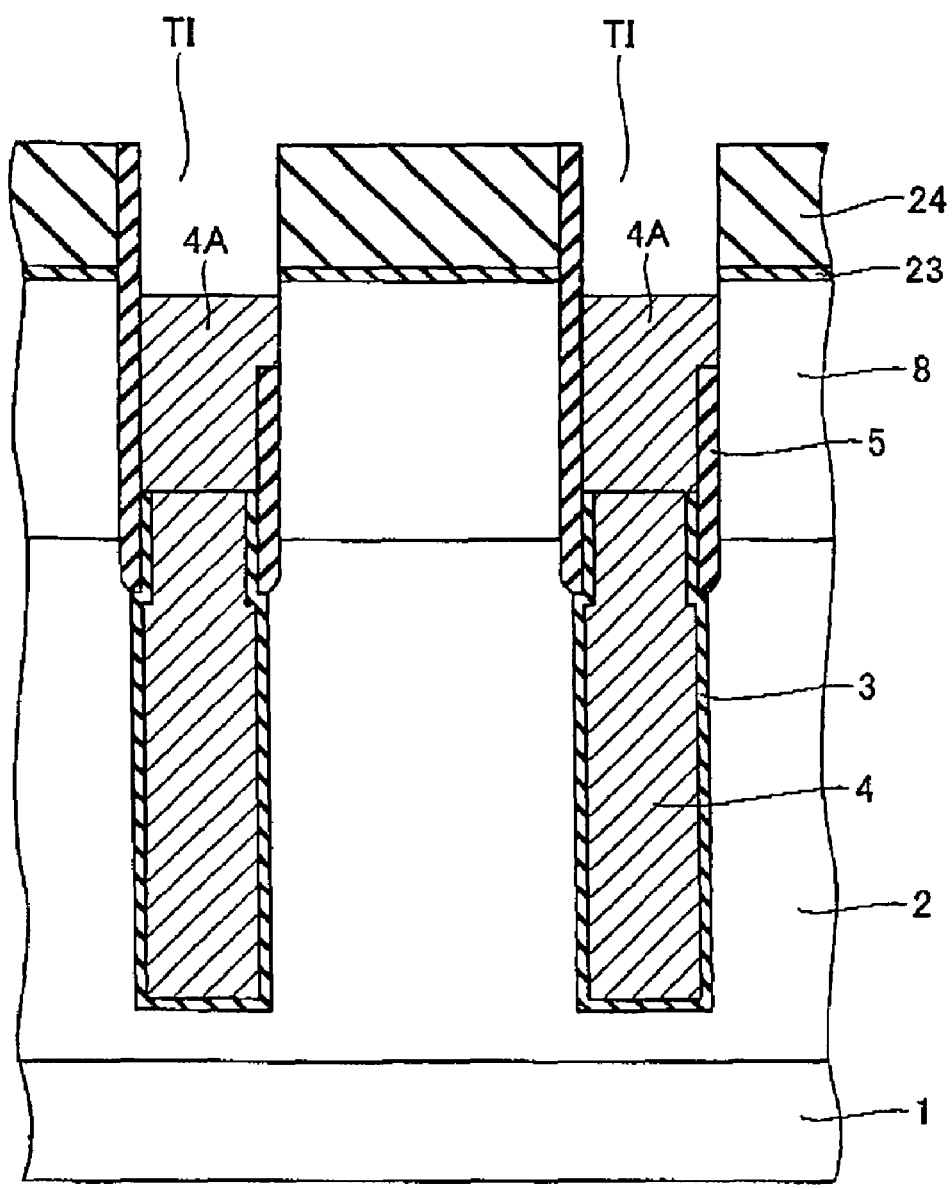
FIG. 7 shows a process step of manufacturing the semiconductor device according to the first embodiment.

Thereafter, over the entire surface including the upper surface of the storage node electrode 4 in the trench TI, polysilicon doped with an impurity such as As and P is deposited and then etched back to form the buried contact 4A as shown in FIG. 7. The buried contact 4A is formed in contact with the base region 8 on the side for use in formation of the cell transistor.

Figure 8:
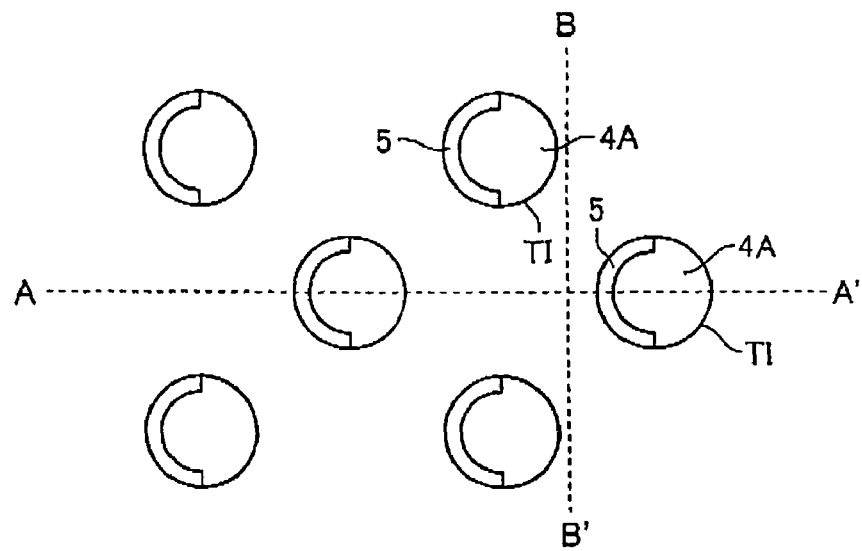
FIG. 8 shows a process step of manufacturing the semiconductor device according to the first embodiment.

A plan view of the trenches TI seen from above is shown in FIG. 8. A number of cylindrically formed trenches TI are arrayed in grid on the semiconductor substrate 1 to form respective trench capacitors therein. Adjacent to these trench capacitors, respective cell transistors, not shown, are formed to configure respective DRAM cells. FIG. 1 is a cross-sectional view taken along A-A' in FIG. 8. As shown in FIG. 8, the collar insulation film 5 not ion-implanted and not wet-etched is formed in the shape of a semicircular arc along the left side of the trench TI in FIG. 8, that is, the side opposite the cell transistor. As a result, the buried strap 4A is brought into contact with the base region 8 only at the side for use in formation of the cell transistor to be connected, and is isolated from the base region 8 at the opposite side by the collar insulation film 5.

Figure 9:
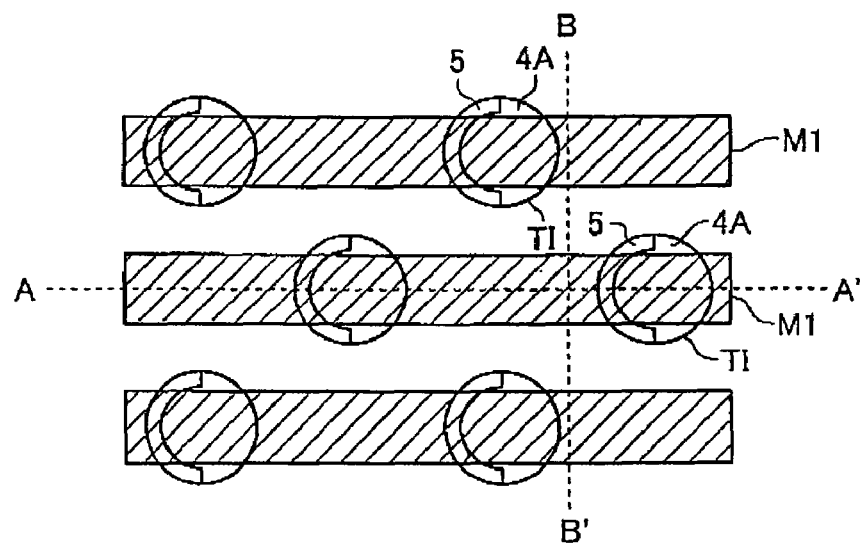
FIG. 9 shows a process step of manufacturing the semiconductor device according to the first embodiment.

The DRAM cells thus configured are isolated from each other in the B-B' direction by device isolation trenches. To form the device isolation trenches, a line-and-space shaped resist pattern M1 is formed as shown in FIG. 9, and FIG. 10 that shows cross-sectional views taken along A-A' and B-B' in FIG. 9. This resist pattern M1 is used as a mask for etching, as shown in FIG. 11, to form trenches TJ having the direction of the length in the A-A' direction. This etching also etches off the buried capacitor 4A and the end portions of the collar insulation film 5 (the portions not hatched in FIG. 9), not covered with the mask M1, simultaneously. A silicon oxide film is deposited in the trenches TJ by a CVD process and planarized by a CMP process with a stopper of the silicon nitride film 24 to form a device isolation film (not shown in the figure) in the trenches TJ. Such the device isolation film buried in the trenches TJ are effective to isolate the DRAM cells from each other in the B-B' direction.

Figure 12:
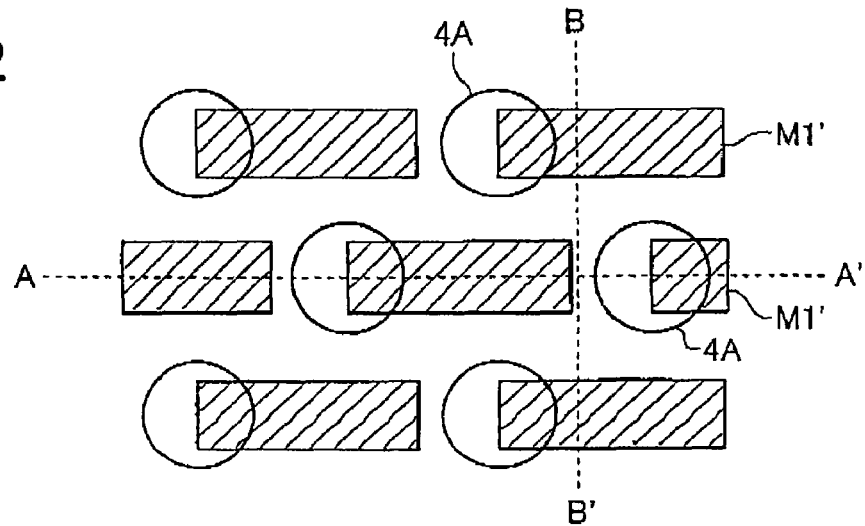
FIG. 12 shows a process step of manufacturing a conventional semiconductor device having a trench capacitor structure.

The prior art manufacturing method of Patent Document 1 is briefly described below with reference to FIG. 12. In this method, the buried straps 4A are buried entirely in the trenches, and then a resist pattern M1' is formed covering the trenches partly as shown in FIG. 12. This resist pattern is used as a mask to form isolation trenches each only on one side of the buried strap 4A (the opposite side far from the cell transistor). Thus, it is required to form the resist pattern M1' as an island-shaped pattern separated per trench capacitor. This makes it difficult to respond to fine patterning. With this regard, in the manufacturing method of the embodiment, the mask pattern M1 can be made as the so-called line-and-space shaped resist pattern that extends in the direction along alignment of the trench capacitor and the cell transistor. Therefore, it is also easy to respond to fine patterning.

Second Embodiment

Figure 13:
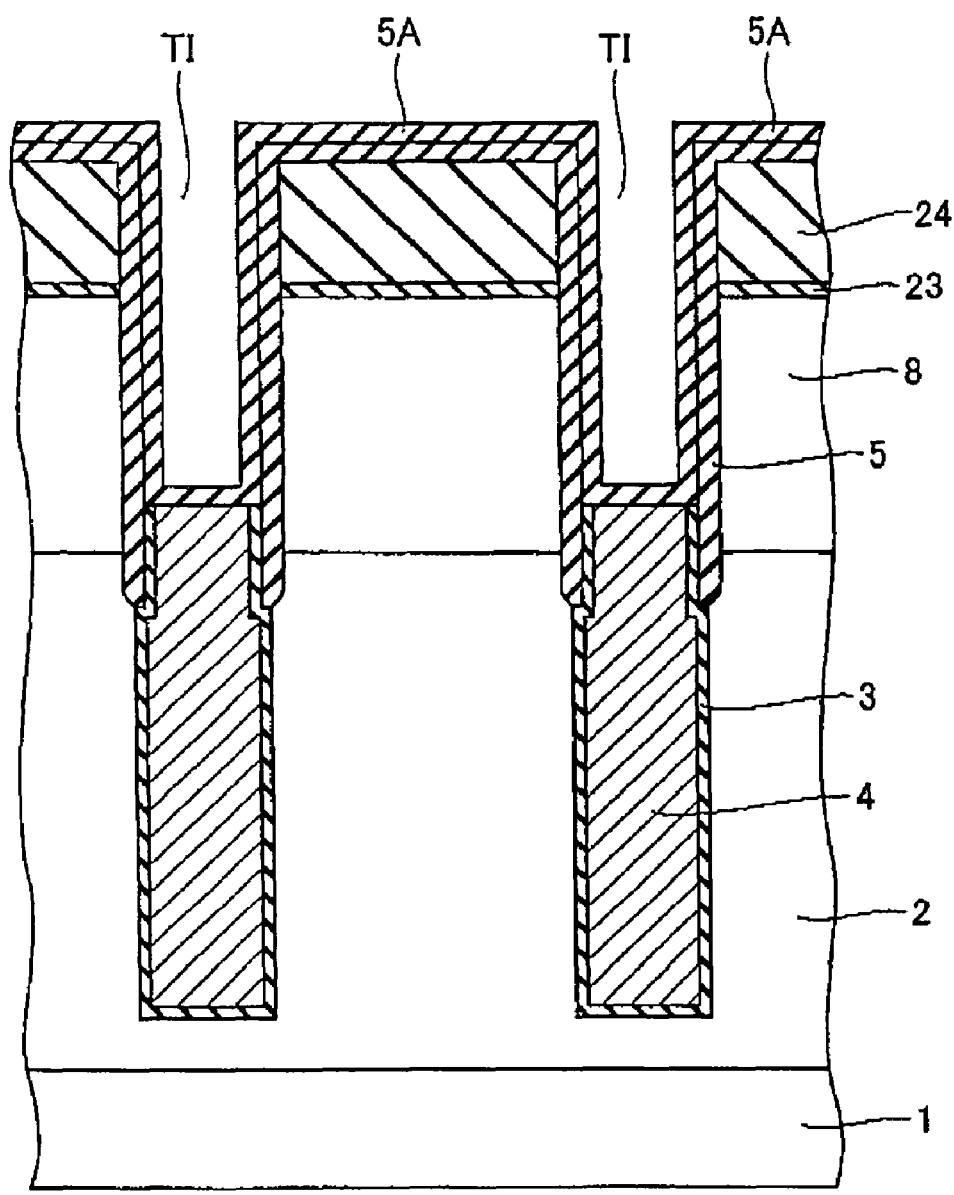
FIG. 13 shows a process step of manufacturing a semiconductor device according to a second embodiment of the present invention.
Figure 14:
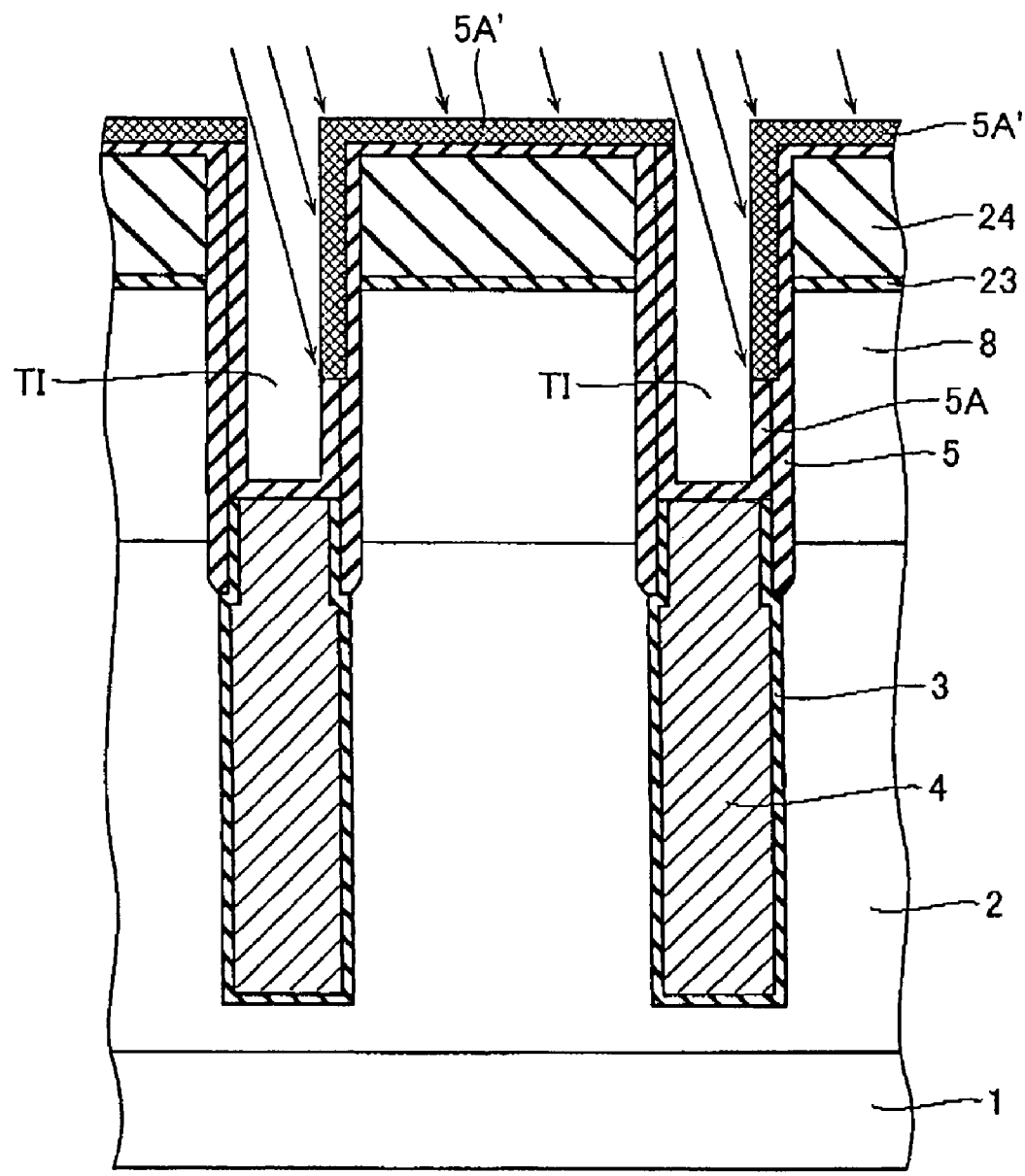
FIG. 14 shows a process step of manufacturing the semiconductor device according to the second embodiment of the present invention.

Process steps of manufacturing a semiconductor device according to a second embodiment of the present invention are described next with reference to FIGS. 13-15. The process steps of manufacturing the semiconductor device of this embodiment are executed like the first embodiment up to the steps of FIGS. 1-4. Thereafter, however, a silicon oxide film 5A is deposited as an additional insulation film over the entire surface of the collar insulation film 5 as shown in FIG. 13. This point is different from the first embodiment. Ion implantation is applied to the silicon oxide film 5A from one of slanting directions, as shown in FIG. 14, to introduce ions into a part 5A' of the silicon oxide film 5A, and the front surface (not reaching the rear surface) of the collar insulation film 5 remaining behind the part 5A'. The ions to be implanted are selected from boron (B), phosphorous (P), arsenic (As), antimony(Sb), silicon (Si), and germanium (Ge) like the first embodiment. When B, P, As, or Sb is employed, a process of heating at 800° C. for a short time may be added. Ion implantation energy is appropriately selected such that the implanted ions stop at some midpoint in the collar insulation film 5, at some midpoint close to the front surface, and can not reach the rear surface, that is, can not penetrate through the rear surface of the collar insulation film 5. This is effective to prevent the implanted ions from reaching the base region 8 to worsen the property of the memory cell transistor and cause crystal defects in the base region 8.

Next, a chemical solution containing hydrogen fluoride (HF), or otherwise HF vapor is employed for etching. In the silicon oxide film 5A and the collar insulation film 5, the parts ion-implanted have a higher etching rate, and the parts shaded on ion implantation and not ion-implanted have a lower etching rate. Therefore, the ion-implanted parts 5A' are etched off first, and the shaded parts and the collar insulation film 5 behind the parts 5A' remain after removal of the parts 5A'. Subsequently, the etching is carried on to remove the silicon oxide film 5A in the trenches TI, and the collar insulation film 5 remaining behind the parts 5A' (the collar insulation film 5 remaining on the ion-implanted side). As a result, the same state can be obtained as the first embodiment in FIG. 6. The second embodiment is more advantageous than the first embodiment because the second embodiment is possible to prevent the degradation of the property of the memory cell transistor and the occurrence of crystal defects in the base region 8. After the state shown in FIG. 15 is obtained, the same procedure as that described with FIGS. 7-11 is executed to complete the semiconductor device as shown in FIG. 1.

Third Embodiment

A semiconductor device and method of manufacturing the same according to a third embodiment of the present invention is described next with reference to FIGS. 16-22. This embodiment relates to the semiconductor device and manufacturing method in which the buried strap 4A is not directly brought into contact with the diffused region 9 of the cell transistor. Instead, the buried strap is brought into contact with the diffused region 9 via a surface strap formed on the surface of the buried strap. This point is different from the above embodiments.

Figure 15:
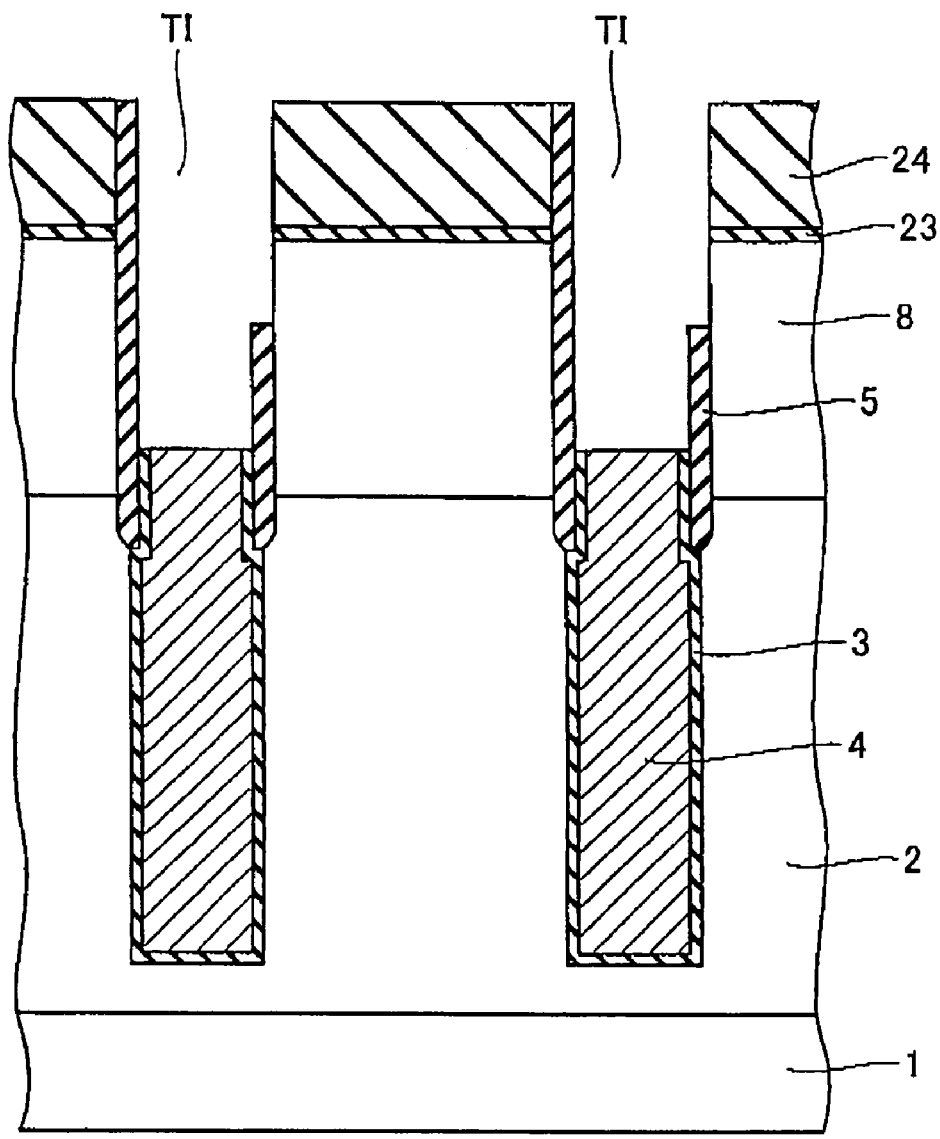
FIG. 15 shows a process step of manufacturing the semiconductor device according to the second embodiment of the present invention.
Figure 16:
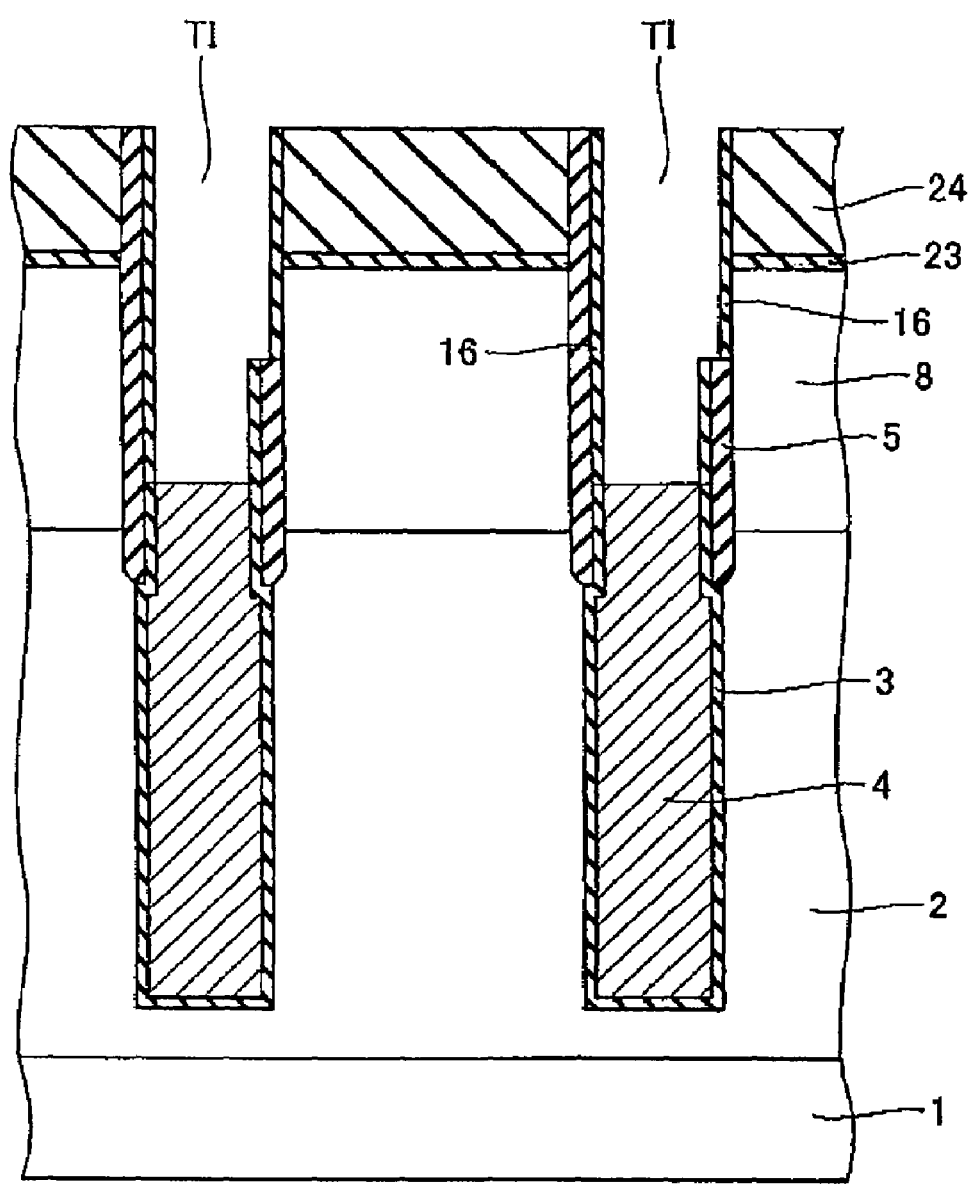
FIG. 16 shows a process step of manufacturing a semiconductor device according to a third embodiment of the present invention.
Figure 17:
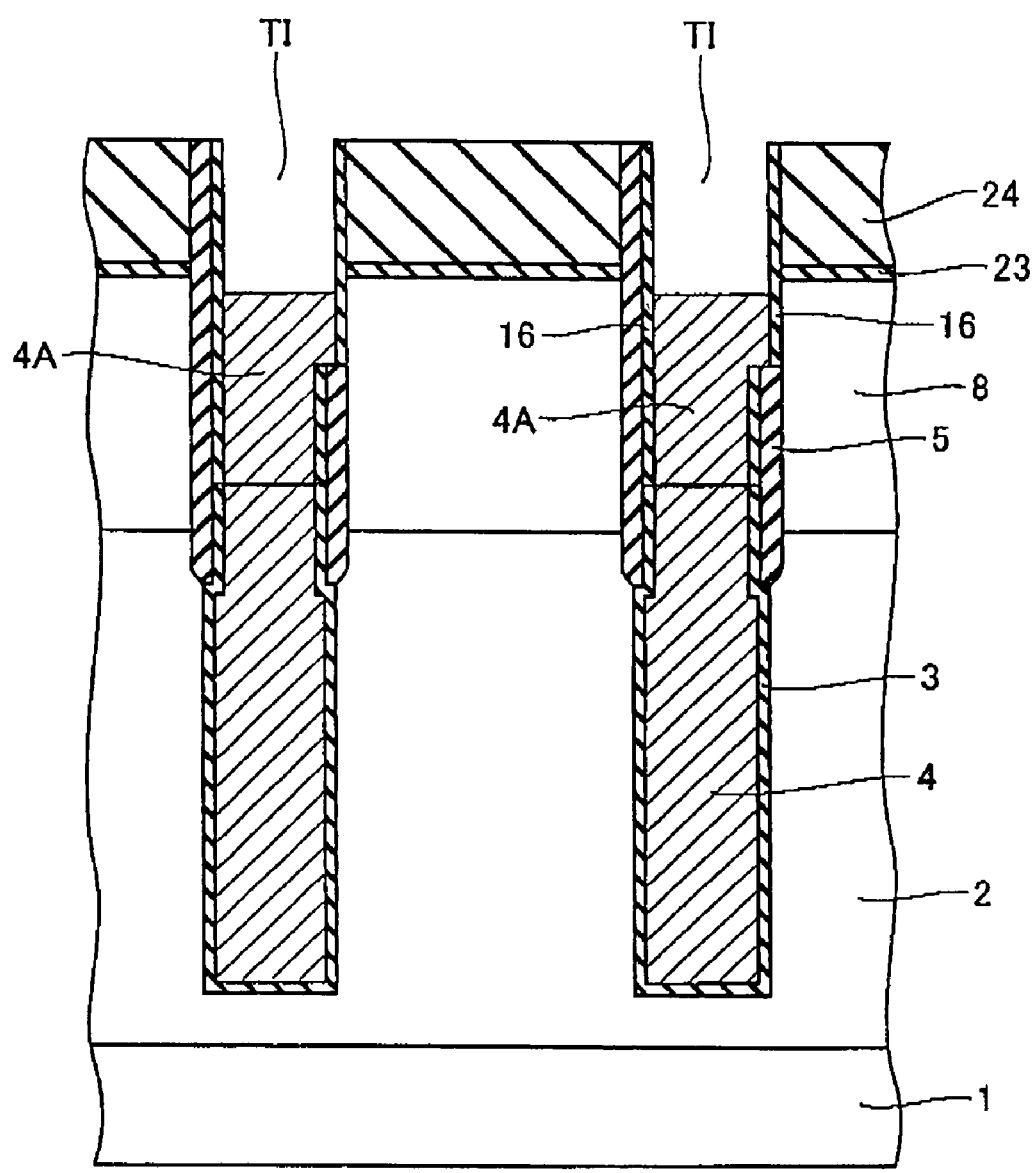
FIG. 17 shows a process step of manufacturing the semiconductor device according to the third embodiment of the present invention.
Figure 18:
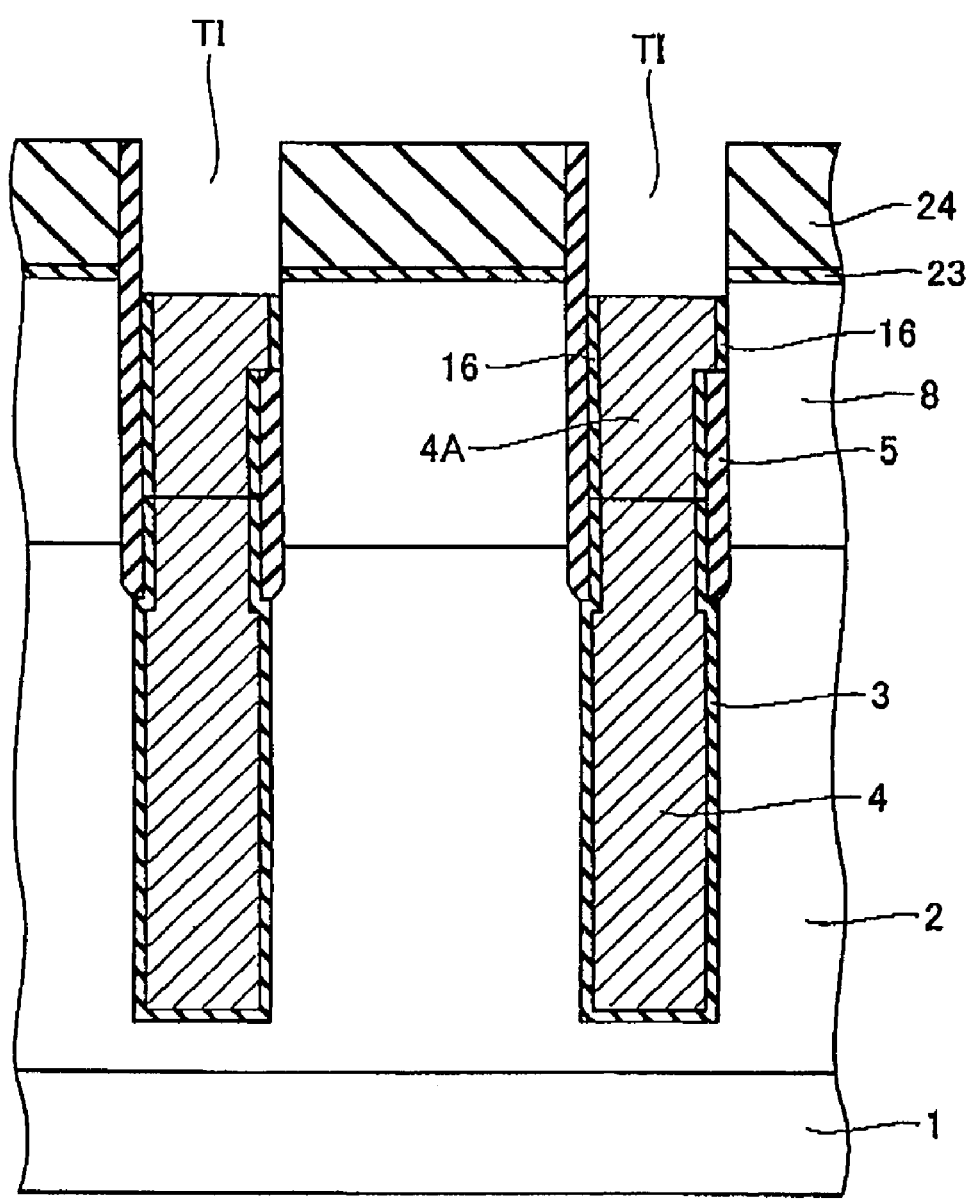
FIG. 18 shows a process step of manufacturing the semiconductor device according to the third embodiment of the present invention.

Process steps up to that of FIG. 6 or 15 are similar to those of the above embodiments. Different from the above embodiments, a silicon nitride film 16 is formed on the inner wall of the trench TI including the base region 8 exposed after etching of the collar insulation film 5, as shown in FIG. 16. The silicon nitride film 16 is deposited over the entire surface including the inside of the trench TI by CVD, then etched back by dry etching, and left only on the sidewall in the trench TI. The silicon nitride film 16 is controlled to have a thickness sufficiently thinner than the thickness of the collar insulation film 5. In an example, the collar insulation film 5 has a thickness of 20 nm while the silicon nitride film 16 has a thickness of about 5 nm. Thereafter, polysilicon doped with an impurity such as As and P is deposited on the surface including the inside of the trench TI and then etched back to form the buried strap 4A (FIG. 17). Subsequently, a wet etching is applied to remove the silicon nitride film 16 exposed in the sidewall (FIG. 18).

Figure 19:
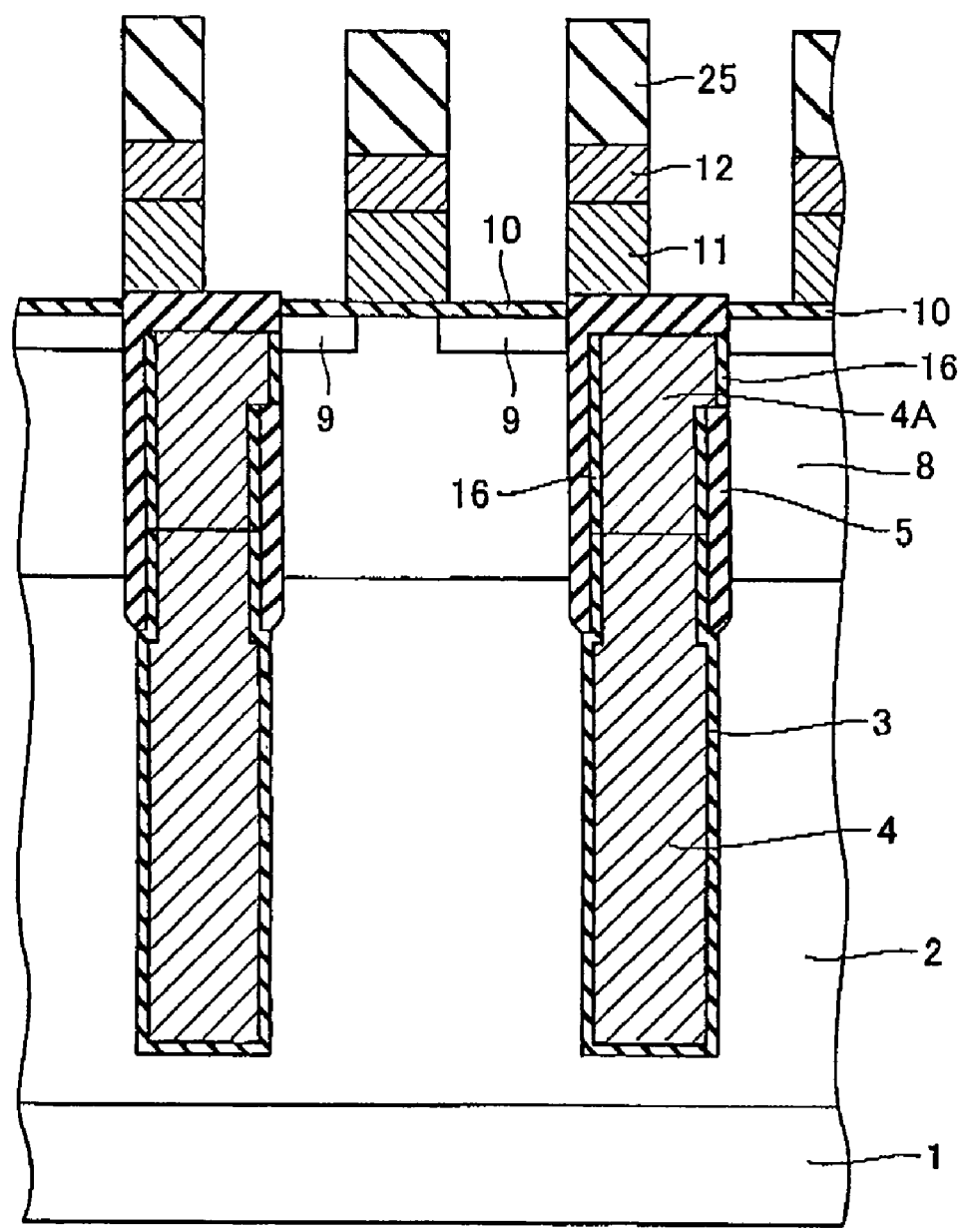
FIG. 19 shows a process step of manufacturing the semiconductor device according to the third embodiment of the present invention.
Figure 20:
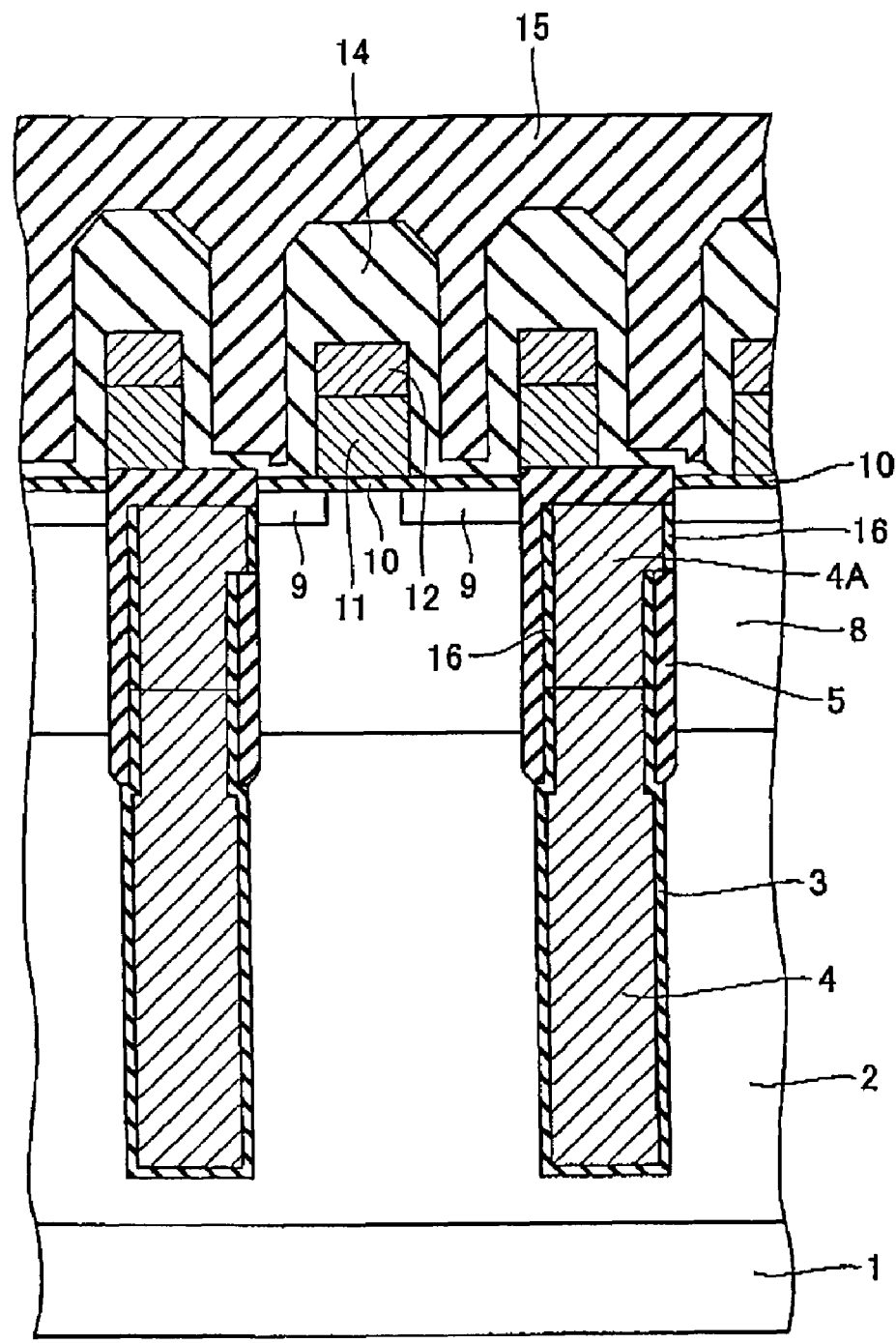
FIG. 20 shows a process step of manufacturing the semiconductor device according to the third embodiment of the present invention.

Subsequently, well-known MOSFET processes are executed to form the diffused-regions 9 and the gate structures (11, 12) as shown in FIG. 19. The reference numeral 25 in FIG. 19 denotes a resist pattern for use in formation of the gate structures. Thereafter, the resist pattern 25 is removed by ashing, and the interlayer insulator 14 is deposited over the entire surface by CVD. Then, a dry etching is applied to form spaces for formation of the transistor wire 13, and a BPSG film 15 is buried in the spaces to obtain the structure of FIG. 20.

Figure 21:
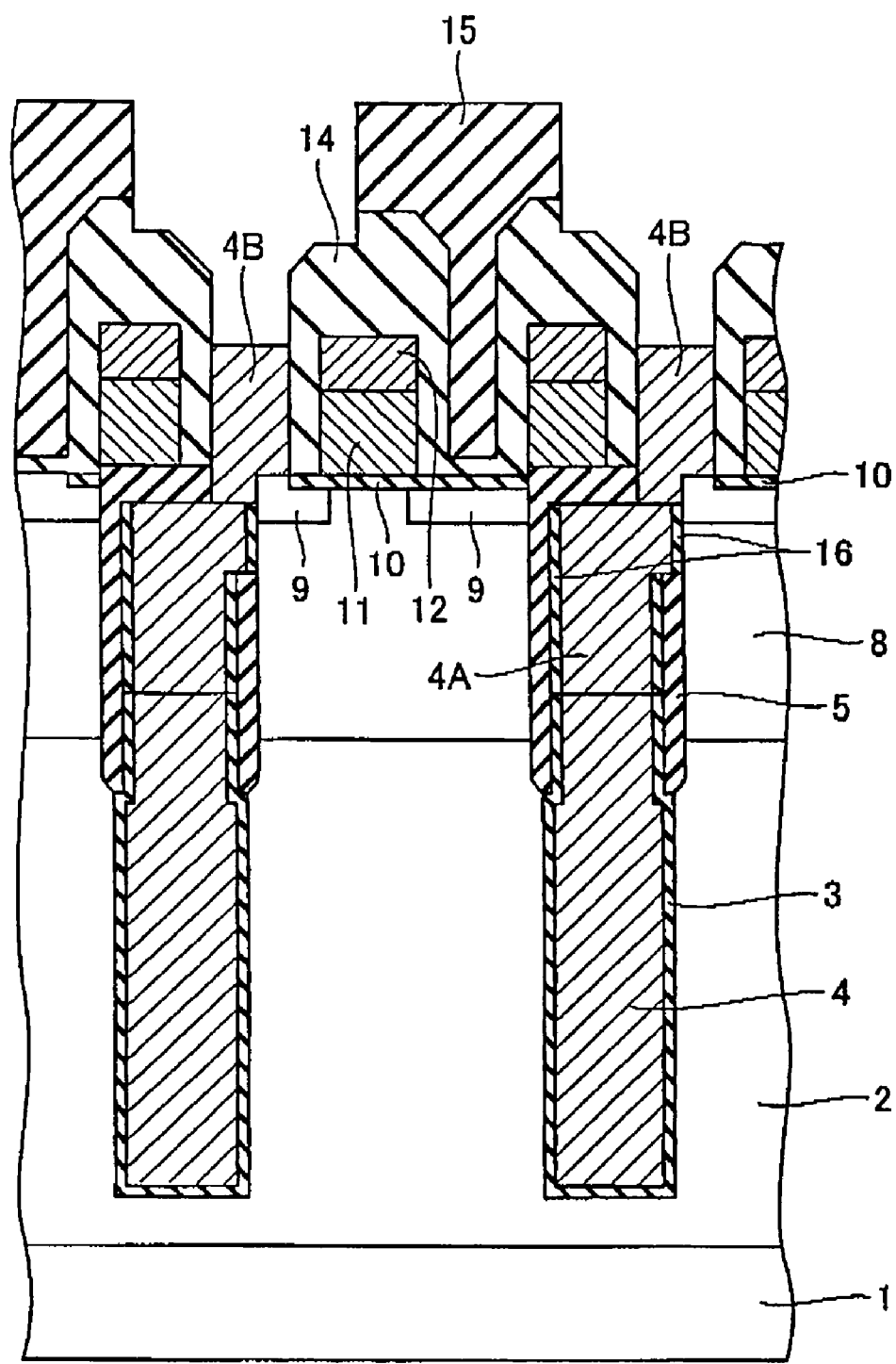
FIG. 21 shows a process step of manufacturing the semiconductor device according to the third embodiment of the present invention.
Figure 22:
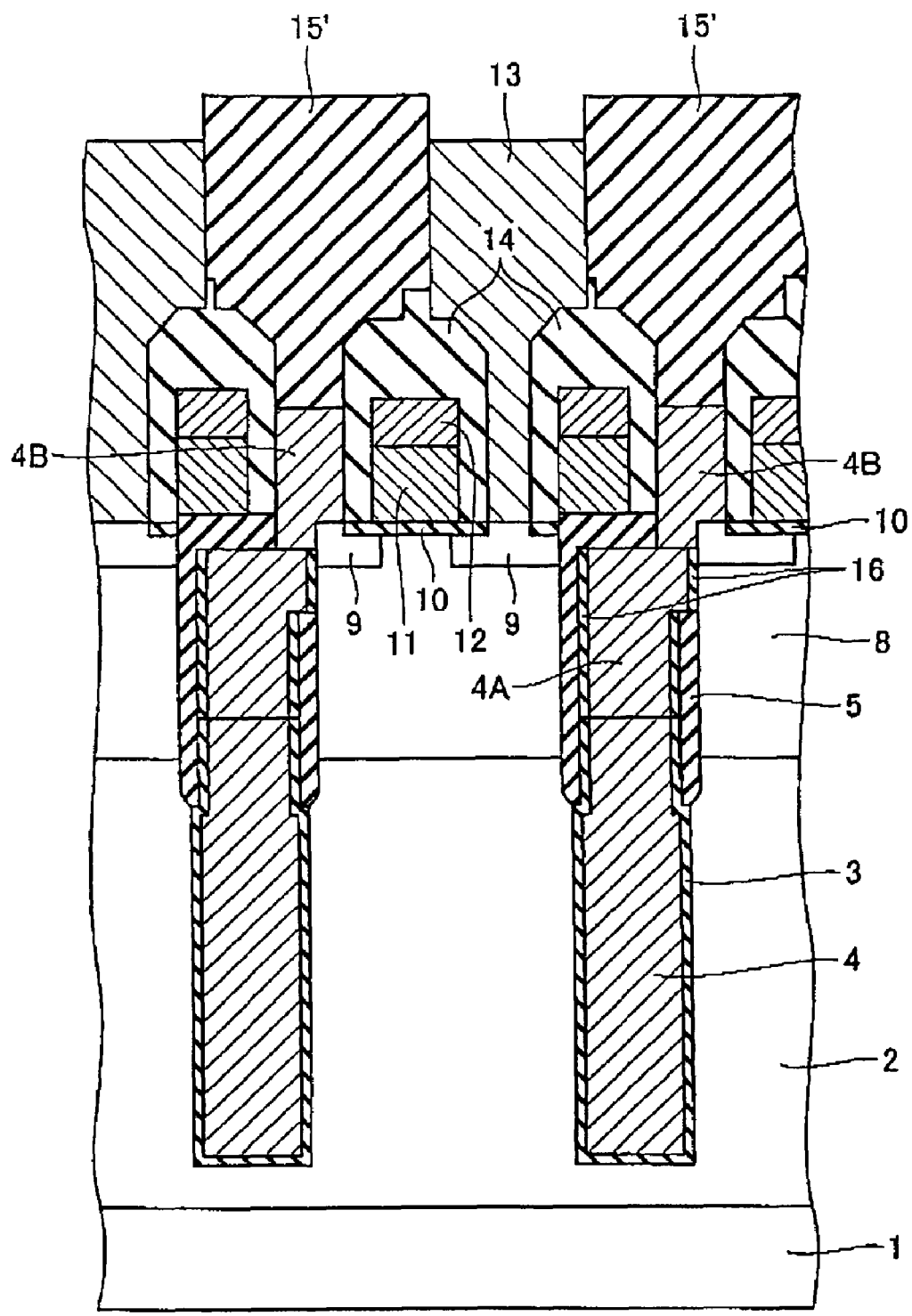
FIG. 22 shows a cross-sectional view of the semiconductor device according to the third embodiment of the present invention.

Further, processes of lithography and dry etching are employed to form trenches extending to the upper right portion of the buried strap 4A in FIG. 21 through the silicon nitride film 14 and the BPSG film 15. In addition, As- or P-doped polysilicon is buried in the trenches and then etched back to form the surface strap 4B. Through the surface strap 4B and the buried strap 4A, the trench capacitor is connected to the diffused region 9 of the cell transistor. A BPSG film 15' is further deposited thereon, and the transistor wire 13 is formed by a well-known technology to complete the semiconductor device of this embodiment as shown in FIG. 22.

In this embodiment, also on the side facing the diffused region 9 of the cell transistor, the silicon nitride film 16 is located between the buried strap 4A and the base region 8. Accordingly, it causes no problem associated with the diffusion of the impurity such as As and P into the base region 8 from the storage node electrode 4 and the buried strap 4A to worsen the property of the cell transistor. The silicon nitride film 16 can be designed to have a thinner thickness than that of the collar insulation film 5. Accordingly, it is possible to ensure a sufficient alignment margin on lithography between the surface strap 4B and the buried strap 4A.

Although the embodiments of the present invention have been described above, the present invention is not limited to these embodiments but rather can be given various modifications and additions without departing from the sprit and scope of the invention.

What is claimed is:

1. A semiconductor device comprising:
   a cell transistor including diffused regions formed in a surface of a semiconductor substrate;
   a trench capacitor formed in said semiconductor substrate for configuring a DRAM cell together with said cell transistor;
   a buried strap formed in said semiconductor substrate to connect said diffused region to said trench capacitor; and
   a collar insulation film formed on sides of said buried strap;
   wherein said buried strap is isolated from said semiconductor substrate at the opposite side far from said cell transistor by said collar insulation film extending to said surface of said semiconductor substrate, and
   wherein said buried strap is isolated from said semiconductor substrate by a silicon nitride film at a side opposite said cell transistor and connected to said diffused region via a surface strap connected to top of said buried strap.

2. The semiconductor device according to claim 1, wherein said buried strap is formed of impurity-doped polysilicon.

3. The semiconductor device according to claim 1, wherein said surface strap is formed-of impurity-doped polysilicon.

* * * * *